US010348008B2

(12) United States Patent
Nakamura et al.

(10) Patent No.: US 10,348,008 B2
(45) Date of Patent: Jul. 9, 2019

(54) CONTACT

(71) Applicant: Kitagawa Industries Co., Ltd., Aichi (JP)

(72) Inventors: Tatsuya Nakamura, Aichi (JP); Kazushige Ueno, Aichi (JP)

(73) Assignee: Kitagawa Industries Co., Ltd., Aichi (JP)

( * ) Notice: Subject to any disclaimer, the term of this patent is extended or adjusted under 35 U.S.C. 154(b) by 0 days.

(21) Appl. No.: 16/081,678

(22) PCT Filed: Mar. 2, 2017

(86) PCT No.: PCT/JP2017/008299
§ 371 (c)(1),
(2) Date: Aug. 31, 2018

(87) PCT Pub. No.: WO2017/150673
PCT Pub. Date: Sep. 8, 2017

(65) Prior Publication Data

US 2019/0027843 A1 Jan. 24, 2019

(30) Foreign Application Priority Data

Mar. 2, 2016 (JP) ................................ 2016-040171

(51) Int. Cl.
*H05K 1/14* (2006.01)
*H01R 12/57* (2011.01)
(Continued)

(52) U.S. Cl.
CPC ............... *H01R 12/57* (2013.01); *H01R 4/02* (2013.01); *H01R 12/707* (2013.01); *H01R 13/24* (2013.01); *H01R 43/0256* (2013.01)

(58) Field of Classification Search
CPC ........................ H01R 13/2428; H01R 13/2442
(Continued)

(56) References Cited

U.S. PATENT DOCUMENTS 4,553,192 A * 11/1985 Babuka ................. H05K 3/325 361/743
5,655,913 A * 8/1997 Castaneda ............. H01R 12/57 439/66

(Continued)

FOREIGN PATENT DOCUMENTS

CN 2552177 Y 5/2003
JP 4482533 B2 6/2010

OTHER PUBLICATIONS

International Search Report for Application No. PCT/JP2017/008299 dated May 30, 2017.

(Continued)

*Primary Examiner* — Neil Abrams
(74) *Attorney, Agent, or Firm* — Jenkins, Wilson, Taylor & Hunt, P.A.

(57) ABSTRACT

The contact includes a base portion, a contact portion, and a spring portion integrally molded with a thin metal plate. The spring portion includes a first bending portion, a flat plate portion, and a second bending portion. The first bending portion is bent such that a first surface of the thin plate is on an outer peripheral side, and the second bending portion is bent such that a second surface of the thin plate is on an outer peripheral side. The thin plate has a thickness t of from 0.10 to 0.15 mm, a curvature radius R1 of the first bending portion is from 0.6 to 1.0 mm, and a ratio L/R1 of a length L between the first bending portion and the second bending portion of the flat plate portion to the curvature radius R1 is configured to satisfy $0<L/R1\leq 4$.

12 Claims, 3 Drawing Sheets

(51) Int. Cl.
*H01R 13/24* (2006.01)
*H01R 4/02* (2006.01)
*H01R 12/70* (2011.01)
*H01R 43/02* (2006.01)

(58) Field of Classification Search
USPC .............................................. 439/66, 81, 862
See application file for complete search history.

(56) References Cited

U.S. PATENT DOCUMENTS 6,873,168 B2 * 3/2005 Kazama ............. G01R 1/06716 324/755.01
7,097,519 B2 * 8/2006 Mattejat .............. H01M 8/0247 439/862
7,189,077 B1 * 3/2007 Eldridge .................. G01R 3/00 257/E21.582
7,284,991 B2 * 10/2007 Noda ................ H01L 23/49811 439/66
8,052,428 B2 * 11/2011 Tsao ....................... H01R 13/24 439/66
8,569,626 B2 * 10/2013 Kurita .................... H01R 12/57 174/94 R
8,760,885 B2 * 6/2014 Lee ...................... H05K 9/0067 361/679.01
9,040,830 B2 * 5/2015 Kobayashi ......... H01R 13/2442 174/250
9,065,186 B2 * 6/2015 Perrin .................. H01R 9/0515
9,240,645 B1 * 1/2016 Ma ..................... H01R 13/2492
9,281,591 B2 * 3/2016 Kurita .................. H05K 9/0016
9,570,827 B2 * 2/2017 Kurita .................... H01R 13/15
9,787,011 B2 * 10/2017 Kurita .................... H01R 13/02
10,014,610 B2 * 7/2018 Kurita ...................... H01R 4/02

OTHER PUBLICATIONS

English Translation of the International Preliminary Report on Patentability and Written Opinion for PCT Application No. PCT/JP2017/008299 dated May 30, 2017.
Chinese Office Action for Application No. 201780014444.2 dated May 8, 2019.

* cited by examiner

III
1
3
5
7
9A
9B
11A
11B
13
15
17
21
23
25
27A
27B

CONTACT

CROSS-REFERENCE TO RELATED APPLICATION

The present application is filed under the provisions of 35 U.S.C. § 371 and claims the priority of International Patent Application No. PCT/JP2017/008299 filed on Mar. 2, 2017 and of Japanese Patent Application No. 2016-40171 A, filed on Mar. 2, 2016. The disclosures of the foregoing international patent application and Japanese patent application are hereby incorporated by reference in their respective entireties.

TECHNICAL FIELD

The present disclosure relates to a contact.

BACKGROUND ART

A contact that electrically connects a conductor pattern in an electronic circuit board to another conductive member (a housing of an electronic device, for example) is known as a component used for grounding in an electronic circuit board (see Patent Document 1, for example). This contact is soldered to the above-mentioned conductor pattern so as to make contact with the above-mentioned conductive member, and as a result, the conductor pattern and the conductive member are electrically connected.

The contact described in Patent Document 1 includes a base portion and a spring portion. The base portion includes a bonding surface configured to be soldered to a conductor pattern. The spring portion extends from the base portion. The base portion and the spring portion are integrally molded with a thin metal plate. The spring portion includes a first bending portion, a flat plate portion, and a second bending portion. The first bending portion extends from the base portion, and bends into a shape that forms a circular arc in which a thickness direction of the thin plate is a radial direction. The flat plate portion extends in a flat plate shape from the first bending portion. The second bending portion extends from the flat plate portion, and bends into a shape that forms a circular arc in which a thickness direction of the thin plate is a radial direction. Of the two surfaces on the front side and the back side of the thin plate, in a case where the surface that forms the bonding surface of the base portion is defined as a first surface and the surface on the back side of the first surface is defined as a second surface, the first bending portion is bent such that the first surface is on an outer peripheral side. The second bending portion is bent such that the second surface is on an outer peripheral side. Accordingly, as a whole, the first bending portion, the flat plate portion, and the second bending portion are formed in a substantial S shape.

CITATION LIST

Patent Literature

Patent Document 1: JP 4482533 B

SUMMARY OF INVENTION

Technical Problem

Incidentally, in vehicle-mounted devices or the like that are mounted in automobiles, for example, unlike stationary-type electronic devices, vibration is transmitted while the automobile is moving. In electronic devices placed in such vibrating environments, when a contact such as the one described above is used, a load is applied to the spring portion of the contact together with the vibration. Accordingly, as compared with a case where the contact is used in a stationary-type electronic device, fatigue tends to arise in the spring portion. If this fatigue becomes excessive, there is a possibility that the spring portion may break. If the spring portion breaks, the effect of grounding may be reduced. Accordingly, to prevent such problems, it is important to suppress breakage of the spring portion.

However, with regard to a spring portion such as the one described in Patent Document 1 that includes a portion having a substantially S-shaped configuration, no specific mention is made in Patent Document 1 regarding what measures should be taken in order to suppress the breakage of the spring portion.

In one aspect of the present disclosure, it is desirable to provide a contact that can suppress the breakage of the spring portion over a long period of time, even when the contact is used in a vibrating environment.

Solution to Problem

A first aspect of the present disclosure relates to a contact configured to electrically connect a conductor pattern of an electronic circuit board and a conductive member other than the electronic circuit board by being soldered to the conductor pattern and coming into contact with the conductive member. The contact includes a base portion, a contact portion, and a spring portion. The base portion includes a bonding surface configured to be soldered to the conductor pattern. The contact portion is configured to come into contact with the conductive member. The spring portion is a portion interposed between the base portion and the contact portion. The spring portion is configured to press the contact portion toward the conductive member by elastically deforming in a case where the contact portion is in contact with the conductive member. The base portion, the contact portion, and the spring portion are integrally molded with a thin plate formed of a metal. The spring portion includes a first bending portion, a flat plate portion, and a second bending portion. The first bending portion is a portion extending from the base portion, and is configured to bend into a shape that forms a circular arc in which a thickness direction of the thin plate is a radial direction. The flat plate portion extends in a flat plate shape from a location on a side opposite to the base portion of the first bending portion. The second bending portion is a portion extending from a location on a side opposite to the first bending portion of the flat plate portion, and is configured to bend into a shape that forms a circular arc in which a thickness direction of the thin plate is a radial direction. Of two surfaces on a front side and a back side of the thin plate, a surface that forms the bonding surface is defined as a first surface, a surface on a back side of the first surface is defined as a second surface, and the first bending portion is configured to bend such that the first surface is on an outer peripheral side. The second bending portion is configured to bend such that the second surface is on an outer peripheral side. The thin plate has a plate thickness t of from 0.10 to 0.15 mm. The first bending portion has a curvature radius R1 of from 0.6 to 1.0 mm. The flat plate portion and the first bending portion are configured such that a ratio L/R1 of the length L between the first bending portion and the second bending portion of the flat plate portion to the curvature radius R1 satisfies $0<L/R1\leq4$.

In addition, a second aspect of the present disclosure relates to a contact configured to electrically connect a conductor pattern of an electronic circuit board and a conductive member other than the electronic circuit board by being soldered to the conductor pattern and coming into contact with the conductive member. The contact includes a base portion, a contact portion, and a spring portion. The base portion includes a bonding surface configured to be soldered to the conductor pattern. The contact portion is configured to come into contact with the conductive member. The spring portion is a portion interposed between the base portion and the contact portion. The spring portion is configured to press the contact portion toward the conductive member by elastically deforming in a case where the contact portion is in contact with the conductive member. The base portion, the contact portion, and the spring portion are integrally molded with a thin plate formed of a metal. The spring portion includes a first bending portion and a second bending portion. The first bending portion is a portion extending from the base portion, and is configured to bend into a shape that forms a circular arc in which a thickness direction of the thin plate is a radial direction. The second bending portion is a portion extending from a location on a side opposite to the first bending portion of the first bending portion, and is configured to bend into a shape that forms a circular arc in which a thickness direction of the thin plate is a radial direction. Of two surfaces on a front side and a back side of the thin plate, a surface that forms the bonding surface is defined as a first surface, a surface on a back side of the first surface is defined as a second surface, and the first bending portion is bent such that the first surface is on an outer peripheral side. The second bending portion is bent such that the second surface is on an outer peripheral side. The thin plate has a plate thickness t of from 0.10 to 0.15 mm. The first bending portion has a curvature radius R1 of from 0.6 to 1.0 mm.

When comparing the above-mentioned first aspect and second aspect, the structures thereof differ as to whether or not the above-mentioned flat plate portion is included. However, other than that, they have similar structures. In a contact configured in this way, the dimensions of each of the above-mentioned parts and the ratio of the dimensions are set on the basis of the breaking points that occur when a load is actually applied to the spring portion as well as the maximum stress occurrence points predicted by simulation software capable of performing a fatigue analysis.

More specifically, according to the experiments conducted by the inventors, in the case where a flat plate portion was provided, there was a tendency for the breaking points of the spring portion as described above to be in the vicinity of the boundary between the first bending portion and the flat plate portion. In addition, when the flat plate portion was not provided, there was a tendency for the breaking points to be in the vicinity of the boundary between the first bending portion and the second bending portion. When processing the thin metal plate, work hardening tends to occur in the first bending portion, which undergoes bend processing, and characteristic changes such as an increase in hardness and a reduction in elasticity are likely to occur. In contrast, bend processing is not applied to the flat plate portion. Also, in the second bending portion, the bending direction is different from that of the first bending portion. For this reason, both the flat plate portion and the second bending portion have different characteristics than those of the first bending portion. Accordingly, the strength characteristics are discontinuous in the above-mentioned boundary vicinity, and it is conjectured that this is the primary reason that breakage is likely to occur in the vicinity of the above-mentioned boundary.

In contrast, when the maximum stress occurrence points were predicted by simulation software, it was found that the maximum stress occurrence point was in the first bending portion. In addition, if the length L between the first bending portion and the second bending portion in the flat plate portion is less than or equal to a predetermined length, the maximum stress occurrence point is located away from the above-mentioned boundary vicinity. However, it was discovered that when the length L is greater than or equal to a predetermined length, as the length L increases, the maximum stress occurrence point approaches the above-mentioned boundary vicinity. It is conjectured that breakage in the boundary vicinity is more likely to occur if the maximum stress occurrence point approaches the above-mentioned boundary. In contrast, it is conjectured that if the maximum stress occurrence point is away from the above-mentioned boundary vicinity, the load on the boundary vicinity will be reduced, and breakage in the boundary vicinity will be suppressed.

Accordingly, based on these findings, when a numerical range in which the maximum stress occurrence point does not come close to the above-mentioned boundary vicinity was considered, in the case that a thickness t of the thin plate is from 0.10 to 0.15 mm and the curvature radius R1 of the first bending portion is from 0.6 to 1.0 mm, it was discovered that the ratio L/R1 of the length L between the first bending portion and the second bending portion in the flat plate portion to the curvature radius R1 of the first bending portion should be set to $0 \leq L/R1 \leq 4$. Note that in the case that the ratio $L/R1=0$, the length L is 0 in this case, and this corresponds to a case where the flat plate portion does not exist (that is, a case where the first bending portion and the second bending portion are directly connected). Based on these matters, a contact including a flat plate portion and a contact not including a flat plate portion were completed.

Therefore, according to the contacts configured as described above, in comparison with contacts in which the maximum stress occurrence point can exist near the above-mentioned boundary vicinity, breakage of the spring portion can be suppressed over a long period even when used in a vibrating environment.

REFERENCE SIGNS LIST

Figure 1A:
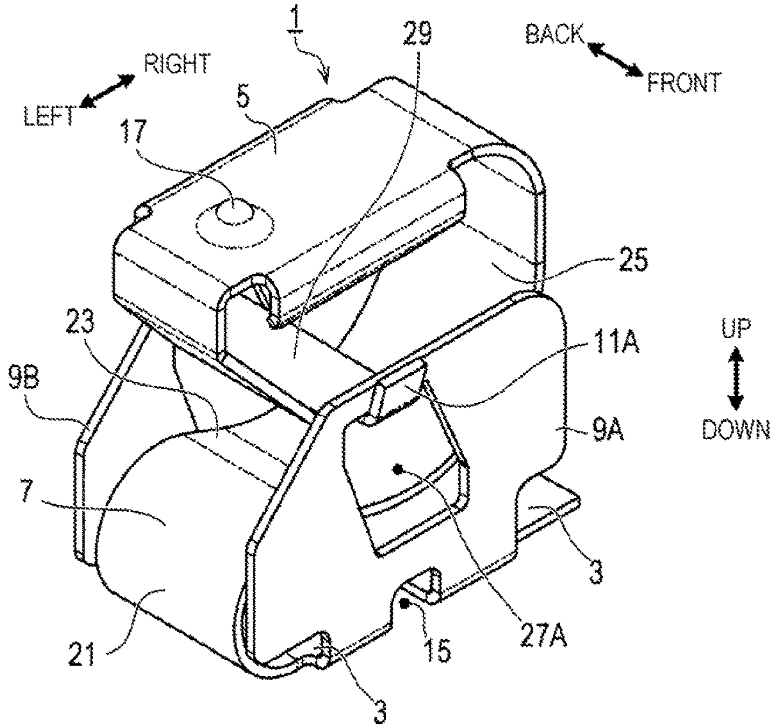
FIG. 1A is a perspective view of a contact as viewed from a left front upper side.
Figure 1B:
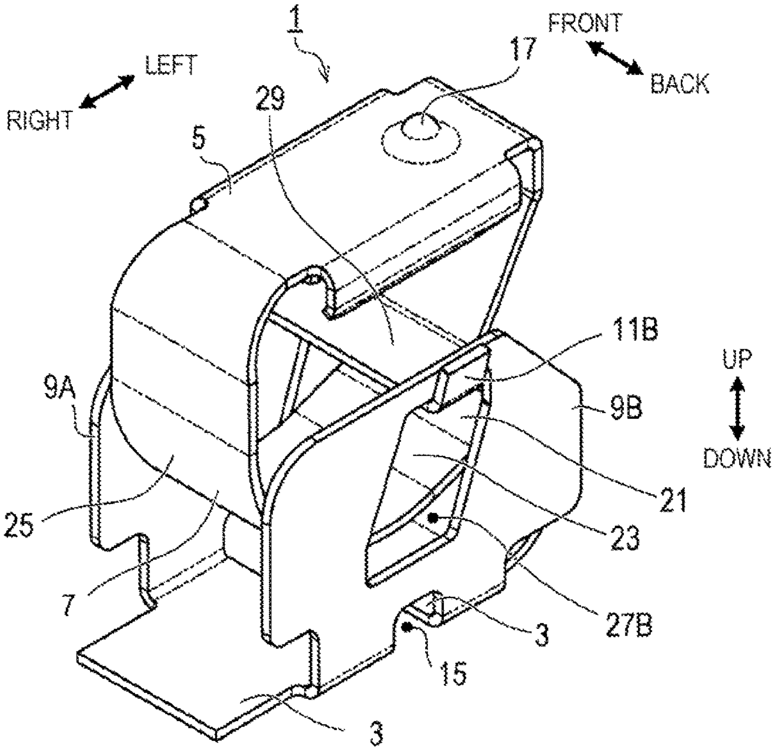
FIG. 1B is a perspective view of the contact as viewed from a right rear upper side.
Figures 2A, 2B, 2C, 2D, 2E, 2F:
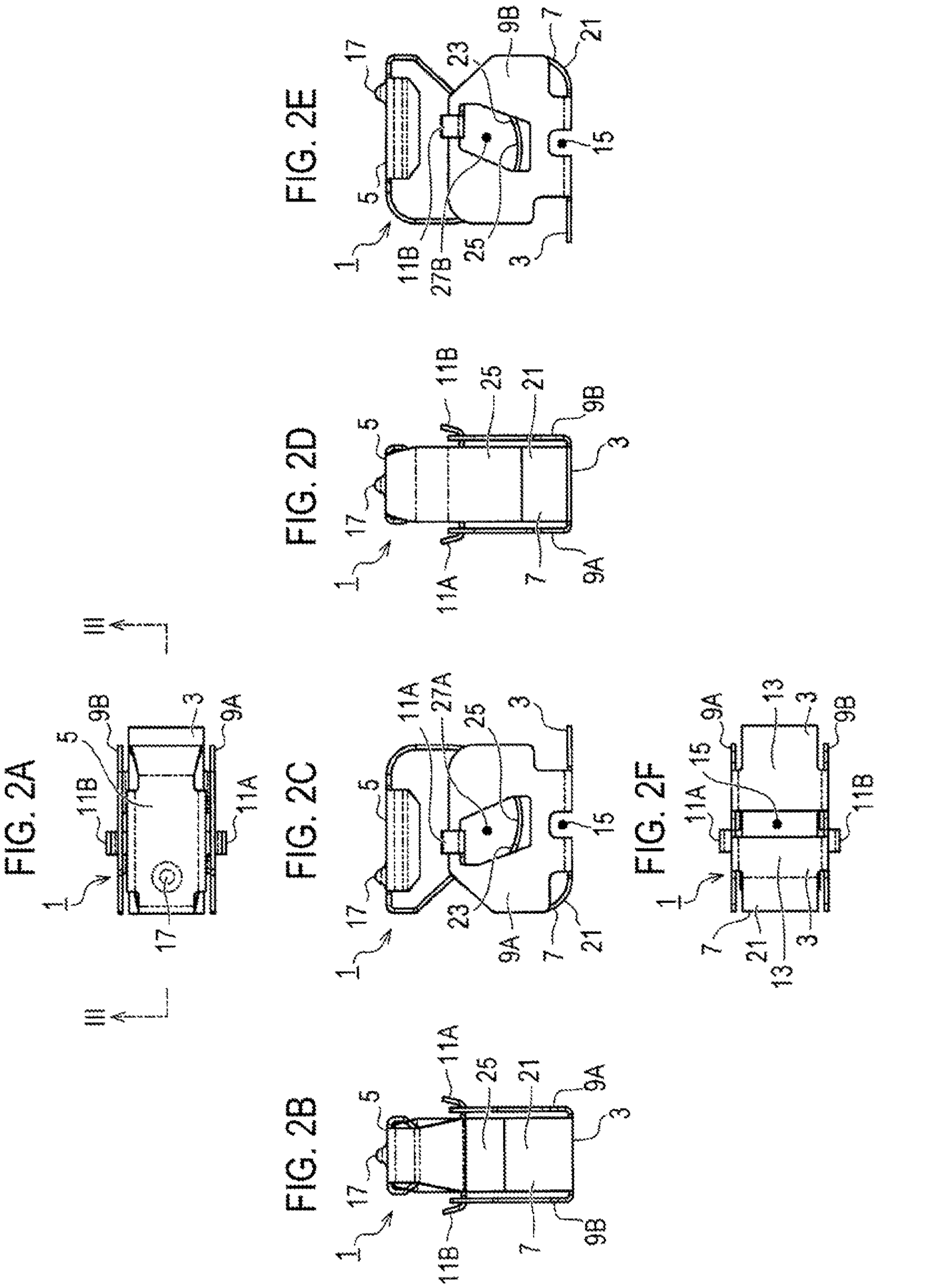
FIG. 2A is a plan view of a contact.
FIG. 2B is a left side view of the contact.
FIG. 2C is a front view of the contact.
FIG. 2D is a right side view of the contact.
FIG. 2E is a rear view of the contact.
FIG. 2F is a bottom view of the contact.

1 Contact
3 Base portion
5 Contact portion
7 Spring portion
9A First side wall portion
9B Second side wall portion
11A First projecting piece
11B Second projecting piece 13 Bonding surface
15 Opening location
17 Protrusion
21 First bending portion
23 Flat plate portion
25 Second bending portion
27A First through-hole
27B Second through-hole

DESCRIPTION OF EMBODIMENTS

The contact described above will be described next according to exemplary embodiments. Note that, in the following description, descriptions will be made using the front, back, left, right, up, and down directions illustrated in the drawings. In the drawings of the 6 sides of the contact (see FIG. 2A to FIG. 2F), each of these directions is defined relatively, such that the direction in which the part in the front view is oriented is defined as the front, the direction in which the part in the back view is oriented is defined as the back, the direction in which the part in the left side view is oriented is defined as left, the direction in which the part in the right side view is oriented is defined as right, the direction in which the part in the plan view is oriented is defined as up, and the direction in which the part in the bottom view is oriented is defined as down. However, these directions are defined only for the purpose of facilitating a simple description of the relative positional relationships of each part constituting the contact. Accordingly, at the time of use of the contact, for example, the directions in which the contact is oriented are freely-selected.

Contact Configuration

As illustrated in FIG. 1A, FIG. 1B, FIG. 2A, FIG. 2B, FIG. 2C, FIG. 2D, FIG. 2E, and FIG. 2F, a contact 1 is configured to electrically connect a conductor pattern of an electronic circuit board and a conductive member other than the electronic circuit board by being soldered to the conductor pattern and coming into contact with the conductive member. The contact 1 includes a base portion 3, a contact portion 5, a spring portion 7, a first side wall portion 9A, a second side wall portion 9B, a first projecting piece 11A, and a second projecting piece 11B. The base portion 3, the contact portion 5, the spring portion 7, the first side wall portion 9A, the second side wall portion 9B, the first projecting piece 11A, and the second projecting piece 11B are integrally formed with a thin metal plate (in the case of the present embodiment, a thin plate of tin-plated beryllium copper for springs that has undergone a reflow treatment).

The base portion 3 includes a bonding surface 13 configured to be soldered to the conductor pattern. In the case of the present embodiment, an opening portion 15 is provided in a range extending from the base portion 3 to the first side wall portion 9A and the second side wall portion 9B. For this reason, the base portion 3 is divided into two sides that sandwich the opening portion 15 (both sides in the left-right direction in the drawing). The contact portion 5 is a portion that comes into contact with the conductive member. In the case of the present embodiment, the contact portion 5 is provided with a protrusion 17 protruding upward in the drawings, and is configured to come into contact with the conductive member with the protrusion 17.

The spring portion 7 is a portion interposed between the base portion 3 and the contact portion 5, and presses the contact portion 5 toward the conductive member by elastically deforming when the contact portion 5 is in contact with the conductive member. The spring portion 7 includes a first bending portion 21, a flat plate portion 23, and a second bending portion 25. The first bending portion 21 is a portion extending from the base portion 3. The first bending portion 21 is bent into a shape that forms a circular arc in which the thickness direction of the thin plate is a radial direction. The flat plate portion 23 extends in a flat plate shape from a location on the side opposite to the base portion 3 of the first bending portion 21. The second bending portion 25 is a portion extending from a location on the side opposite to the first bending portion 21 of the flat plate portion 23. The second bending portion 25 is bent into a shape that forms a circular arc in which the thickness direction of the thin plate is a radial direction. Of the two surfaces on the front and back of the thin plate that constitutes the contact 1, with the surface that forms the above-mentioned bonding surface 13 defined as a first surface and the surface on the back side of the first surface defined as a second surface, the first bending portion 21 is bent such that the first surface is on an outer peripheral side. In addition, the second bending portion 25 is bent such that the second surface is on the outer peripheral side.

The first side wall portion 9A and the second side wall portion 9B are portions extending from the base portion 3. The first side wall portion 9A and the second side wall portion 9B are erected at positions on both sides of the spring portion 7, and the respective second surfaces thereof oppose each other. The first side wall portion 9A and the second side wall portion 9B are respectively provided with a first through-hole 27A and a second through-hole 27B opened in the plate thickness direction (the front and back direction in the drawings). The first projecting piece 11A and the second projecting piece 11B are provided on a portion 29 extending from the contact portion 5 and disposed between the first side wall portion 9A and the second side wall portion 9B, and protrude from both sides of the portion 29 disposed therebetween. The first projecting piece 11A passes through the first through-hole 27A. The second projecting piece 11B passes through the second through-hole 27B. In this way, the respective operating ranges of each of the first projecting piece 11A and the second projecting piece 11B are restricted by the inner peripheries of the first through-hole 27A and the second through-hole 27B. Note that the leading ends in the projecting direction of the first projecting piece 11A and the second projecting piece 11B are bent upward in the drawings.

Figure 3:
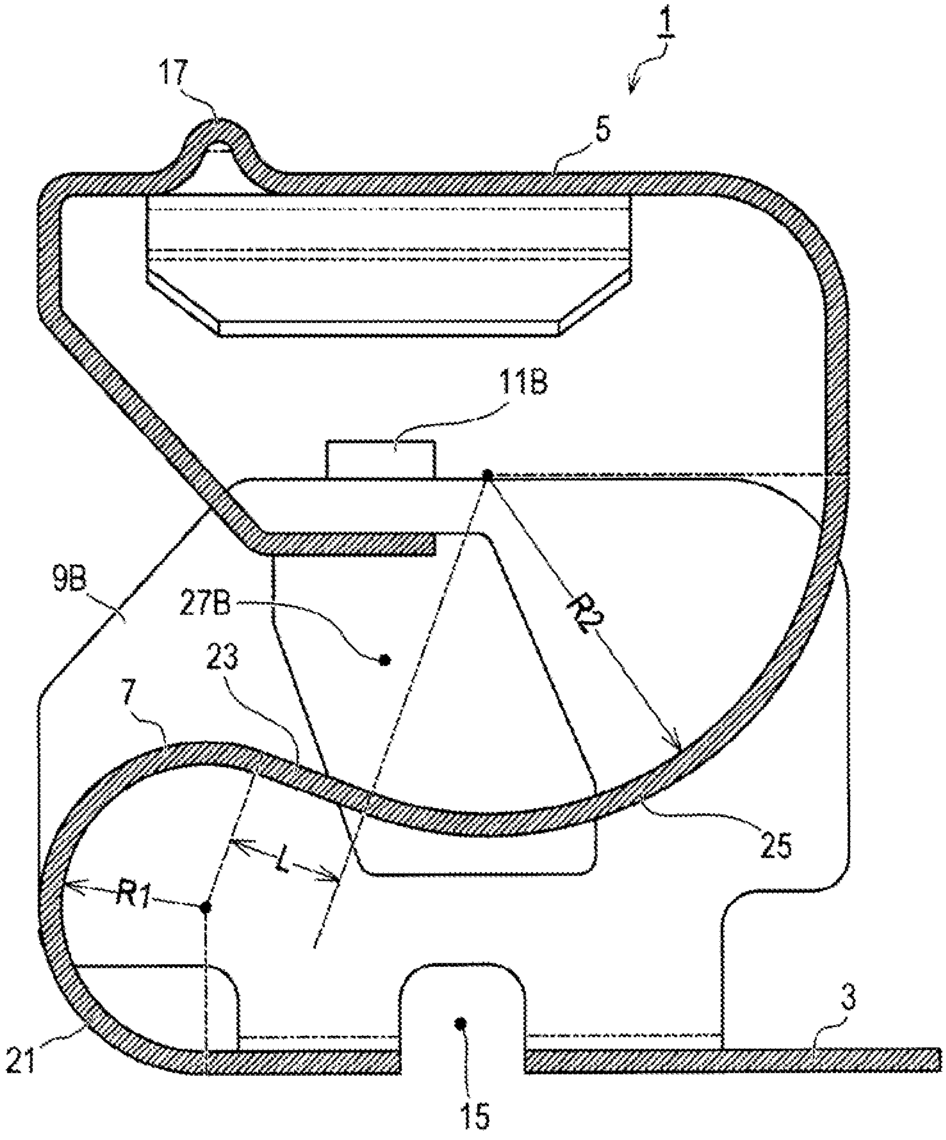
FIG. 3 is a cross-sectional view taken along the line III-III in FIG. 2A.

The thin plate that constitutes each part of the contact 1 has a plate thickness t of from 0.10 to 0.15 mm (however, an example with t=0.12 mm is illustrated in the drawings). The first bending portion 21 has a curvature radius R1 (see FIG. 3) of from 0.6 to 1.0 mm (however, an example with R1=0.8 mm is illustrated in the drawing). The flat plate portion 23 and the first bending portion 21 are configured such that a ratio L/R1 of the length L between the first bending portion 21 and the second bending portion 25 of the flat plate portion 23 to the curvature radius R1 satisfies $0<L/R1\leq4$ (however, an example where L≅0.65 mm, R1≅0.8 mm, and L/R1≅0.81 mm is illustrated in the drawing).

Furthermore, in the case of the present embodiment, the first bending portion 21 and the second bending portion 25 are configured such that the ratio R2/R1 of the curvature radius R2 of the second bending portion 25 to the curvature radius R1 of the first bending portion 21 is $0.25\leq R2/R1\leq4.17$ (however, an example where R1=0.8 mm, R2=1.88 mm, and R2/R1=2.35 is illustrated in the drawing).

The dimensions of each of these parts and the ratio of the dimensions are set on the basis of the breaking points when a load is actually applied to the spring portion 7 as well as the maximum stress occurrence points predicted by simulation software capable of performing a fatigue analysis. Note that, in the case of the present embodiment, SOLIDWORKS Simulation Premium (produced by Dassault Systems Solidworks) is used as the simulation software. According to the experiments conducted by the inventors, in the case that the flat plate portion 23 was provided, there was a tendency for the breaking points of the above-mentioned spring portion 7 to be in the vicinity of the boundary between the first bending portion 21 and the flat plate portion 23, and in the case where the flat plate portion 23 was not provided, there was a tendency for the breaking points to be in the vicinity of the boundary between the first bending portion 21 and the second bending portion 25. When processing the thin metal plate, work hardening tends to occur in the above-mentioned boundary vicinity, and characteristic changes such as an increase in hardness and a reduction in elasticity are likely to occur. Accordingly, it is conjectured that breakage is more likely to occur in the above-mentioned boundary vicinity than in other locations that have lower hardness and greater elasticity.

In contrast, when the maximum stress occurrence points were predicted by simulation software, it was found that the maximum stress occurrence point was in the first bending portion 21. In addition, if the length L between the first bending portion 21 and the second bending portion 25 in the flat plate portion 23 increases to be greater than or equal to a predetermined length, it was found that the maximum stress occurrence point comes closer to the above-mentioned boundary vicinity. It is conjectured that breakage in the boundary vicinity is more likely to occur if the maximum stress occurrence point approaches the above boundary. In contrast, it is conjectured that if the maximum stress occurrence point is away from the above-mentioned boundary vicinity, the load on the boundary vicinity will be reduced, and breakage in the boundary vicinity will be suppressed.

Accordingly, in the present embodiment, configurations were examined to prevent the maximum stress occurrence points from approaching the above-mentioned boundary vicinity. In the cases where the curvature radius R1 of the first bending portion 21 was set to be 0.6 mm, 0.8 mm, and 1.0 mm, Table 1 below shows the results of analyzing where the maximum stress occurrence point occurred in each case while the above-mentioned length L was changed within a range from 0 to 7 mm. Note that the case where the above-mentioned length L=0 corresponds to a case where the flat plate portion 23 does not exist (that is, a case where the first bending portion 21 and the second bending portion 25 are directly connected).

predetermined length, the maximum stress occurrence point is located away from the location of the boundary between the first bending portion 21 and the second bending portion 25. In any of these cases, the location of the maximum stress occurrence point did not change greatly even when the length L was changed. In contrast, when the length L is within a numerical range that is greater than or equal to a predetermined length, there was a tendency for the maximum stress occurrence point to approach the above-mentioned boundary location as the length L became larger. Accordingly, when the length L was gradually increased as shown in Table 1, in the above Table 1, Evaluation A illustrates the case where there was no significant change in the location of the maximum stress occurrence point before and after the increase, and Evaluation B illustrates the case where the location of the maximum stress occurrence point approaches the boundary location after the increase.

For example, in the case where the curvature radius R1 is 0.6 mm, when the length L is increased from 2.5 mm to 3.0 mm, the location of the maximum stress occurrence point begins to approach the boundary location. Accordingly, in Table 1, this is evaluated as Evaluation B in the numerical range where the length L is greater than or equal to 3 mm. Similarly, in the case where the curvature radius R1 is 0.8 mm, when the above-mentioned length L is increased from 4.0 mm to 4.5 mm, the location of the maximum stress occurrence point begins to approach the boundary location. Accordingly, in Table 1, this is evaluated as Evaluation B in the numerical range where the length L is greater than or equal to 4.5 mm. Further, in the case where the curvature radius R1 is 1.0 mm, when the length L is increased from 6.0 mm to 6.5 mm, the location of the maximum stress occurrence point begins to approach the boundary location. Accordingly, in Table 1, this is evaluated as Evaluation B in the numerical range where the length L is greater than or equal to 6.5 mm.

For each of these cases, obtaining the ratios L/R1 of the length L to the curvature radius R1 gives the results shown in Table 1. Accordingly, the maximum value of the ratio L/R1 within the range where Evaluation A is reliably obtained is 4.17. Therefore, in the case where the curvature radius R1 is within the range from 0.6 to 1.0 mm, it is conjectured that if the ratio L/R1 is set to less than or equal to 4.17, the above-described breakage of the spring portion 7 in the boundary vicinity can be suppressed.

Next, in the case where the curvature radius R1 of the first bending portion 21 was fixed to 0.6 mm, and the thickness t of the thin plate that constitutes the contact 1 was set to 0.10 mm, 0.12 mm, and 0.15 mm, Table 2 below shows the

TABLE 1

| | | | L (mm) | | | | | | | | | | | | | | |
|---|---|---|---|---|---|---|---|---|---|---|---|---|---|---|---|---|---|
| | | | 0.0 | 0.5 | 1.0 | 1.5 | 2.0 | 2.5 | 3.0 | 3.5 | 4.0 | 4.5 | 5.0 | 5.5 | 6.0 | 6.5 | 7.0 |
| R1 (mm) | 0.6 | L/R1 | 0.00 | 0.83 | 1.67 | 2.50 | 3.33 | 4.17 | 5.00 | 5.83 | 6.67 | 7.50 | 8.33 | 9.17 | 10.00 | 10.83 | 11.67 |
| | | Evaluation | A | A | A | A | A | A | B | B | B | B | B | B | B | B | B |
| | 0.8 | L/R1 | 0.00 | 0.63 | 0.78 | 1.88 | 2.50 | 3.13 | 3.75 | 4.38 | 5.00 | 5.63 | 6.25 | 6.88 | 7.50 | 8.13 | 8.75 |
| | | Evaluation | A | A | A | A | A | A | A | A | A | B | B | B | B | B | B |
| | 1.0 | L/R1 | 0.00 | 0.50 | 1.00 | 1.50 | 2.00 | 2.50 | 3.00 | 3.50 | 4.00 | 4.50 | 5.00 | 5.50 | 6.00 | 6.50 | 7.00 |
| | | Evaluation | A | A | A | A | A | A | A | A | A | A | A | A | A | B | B |

According to the analysis results, in the case that L>0, when the length L is within a numerical range that is less than or equal to a predetermined length, the maximum stress occurrence point is located away from the location of the boundary between the first bending portion 21 and the flat plate portion 23. In the case that L=0, when the length L is within a numerical range that is less than or equal to a results of analyzing where the maximum stress occurrence point occurred in each case while the above-mentioned length L was changed within a range from 0 to 4.5 mm. Note that, in Table 2, the cases of t=0.12 mm, and L=4.0 mm and 4.5 mm were not evaluated.

TABLE 2

| | | | L (mm) | | | | | | | | | | |
|---|---|---|---|---|---|---|---|---|---|---|---|---|---|
| | | | 0.0 | 0.5 | 1.0 | 1.5 | 2.0 | 2.4 | 2.5 | 3.0 | 3.5 | 4.0 | 4.5 |
| | | | L/R1 | | | | | | | | | | |
| | | | 0.00 | 0.83 | 1.67 | 2.50 | 3.33 | 4.00 | 4.17 | 5.00 | 5.83 | 6.67 | 7.50 |
| t (mm) | 0.10 | Evaluation | A | A | A | A | A | A | B | B | B | B | B |
| | 0.12 | Evaluation | A | A | A | A | A | A | A | B | B | — | — |
| | 0.15 | Evaluation | A | A | A | A | A | A | A | A | B | B | B |

TABLE 3

| | | | R2 (mm) | | | | | | | | |
|---|---|---|---|---|---|---|---|---|---|---|---|
| | | | 0.15 | 0.50 | 1.00 | 1.50 | 2.00 | 2.50 | 3.00 | 3.50 | 4.00 |
| | | | R2/R1 | | | | | | | | |
| | | | 0.25 | 0.83 | 1.67 | 2.50 | 3.33 | 4.17 | 5.00 | 5.83 | 6.67 |
| L (mm) | 4.50 | Maximum Stress Value (MPa) | 723.4 | 725.0 | 728.5 | 733.8 | 741.4 | 751.8 | 733.3 | 770.8 | 778.4 |
| | | Evaluation | A | A | A | A | A | A | A | B | B |
| | 4.95 | Maximum Stress Value (MPa) | 724.7 | 726.5 | 730.2 | 735.6 | 743.1 | 753.3 | 753.0 | 774.3 | 776.5 |
| | | Evaluation | A | A | A | A | A | A | A | B | B |
| | 4.05 | Maximum Stress Value (MPa) | 722.9 | 724.1 | 727.3 | 732.4 | 740.2 | 704.8 | 760.9 | 773.0 | 775.5 |
| | | Evaluation | A | A | A | A | A | A | B | B | B |

According to the analysis results, in the case where the length L is 4.50 mm, for example, increasing the curvature radius R2 from 3.00 mm to 3.50 mm greatly increases the maximum stress value. Accordingly, in Table 3, this is evaluated as Evaluation B in the numerical range where the curvature radius R2 is greater than or equal to 3.50 mm. Similarly, in the case where the length L is 4.95 mm, increasing the curvature radius R2 from 3.00 mm to 3.50 mm greatly increases the maximum stress value. Accordingly, in Table 3, this is evaluated as Evaluation B in the numerical range where the curvature radius R2 is greater than or equal to 3.50 mm. Further, in the case where the length L is 4.05 mm, increasing the curvature radius R2 from 2.50 mm to 3.00 mm greatly increases the maximum stress value. Accordingly, in Table 3, this is evaluated as Evaluation B in the numerical range where the curvature radius R2 is greater than or equal to 3.00 mm.

For each of these cases, obtaining the ratio R2/R1 of the curvature radius R2 to the curvature radius R1 gives the results shown in Table 3. Accordingly, the ratio R2/R1 within the range where Evaluation A is reliably obtained is $0.25 \leq R2/R1 \leq 4.17$, and when the ratio R2/R1 is set so as to fall within such a numerical range, the maximum stress value generated in the first bending portion 21 can be prevented from becoming excessively large. As a result, it is thought that breakage at the spring portion 7 can be suppressed.

Beneficial Effects

As described above, according to the contact 1, the thickness t of the thin plate is set to from 0.10 to 0.15 mm, and the curvature radius R1 of the first bending portion 21 is set to from 0.6 to 1.0 mm. Further, the contact 1 is configured such that the ratio L/R1 of the length L between the first bending portion 21 and the second bending portion 25 in the flat plate portion 23 to the curvature radius R1 satisfies $0 < L/R1 \leq 4$, or configured without the flat plate portion 23 (that is, L=0). Therefore, in comparison with the contact 1 in which the maximum stress occurrence point can exist near the above-mentioned boundary vicinity, breakage of the spring portion 7 can be suppressed over a long period even when used in a vibrating environment.

In addition, in the case of the present embodiment, the ratio R2/R1 of the curvature radius R2 of the second bending portion 25 to the curvature radius R1 of the first bending portion 21 is configured to satisfy $0.25 \leq R2/R1 \leq 4.17$. Accordingly, the maximum stress value generated in the first bending portion 21 can be prevented from becoming excessively large, and in this way, breakage at the spring portion 7 can be suppressed.

In addition, in the case of the present embodiment, the operating ranges of the first projecting piece 11A and the second projecting piece 11B are restricted by the first through-hole 27A and the second through-hole 27B. For this reason, the operating range of the contact portion 5 that moves together with the first projecting piece 11A and the second projecting piece 11B can also be restricted. Accordingly, the contact portion 5 is not displaced to an unexpected location due to the elastic deformation of the spring portion 7, and a state in which the contact portion 5 is properly in contact with the conductive member can be maintained.

In addition, in the case of the present embodiment, the contact portion 5 is provided with a protrusion 17. For this reason, it is possible to reliably bring the contact portion 5 into contact with the conductive member at a location where the protrusion 17 is present. In addition, when the conductive member is brought into contact with the protrusion 17, the contact pressure can be concentrated into a narrower range as compared with cases where the conductive member is in contact with a wider surface than the protrusion 17. Accordingly, when the contact pressure is concentrated in such a narrow range, the oxide film generated in such a range can be easily scraped, and a state with favorable conductivity can be easily maintained.

In addition, in the case of the present embodiment, on one surface orthogonal to the plate thickness direction of the thin plate that constitutes the contact portion 5, the apex of the protrusion 17 is present at a location inside the farthest peripheral edge portion on the one surface. For this reason, unlike the case where the apex of the protrusion is present on the farthest peripheral edge portion of one surface on the one surface orthogonal to the plate thickness direction of the thin plate that constitutes the contact portion 5, the apex of the protrusion 17 is located away from the end face of the thin plate that constitutes the contact portion 5. Accordingly, the protrusion 17 comes into contact with the conductive member at a location separated from the end face of the thin plate. Therefore, contact between the end face (the cutting surface at the time of press processing) of the thin plate that is not coated with the plating film and the conductive member can be avoided, and in this way, the occurrence of corrosion (galvanic corrosion or the like) arising from the contact between dissimilar metals can be suppressed.

Other Embodiments

Although the contact has been described above with reference to exemplary embodiments, the above-described embodiments are merely exemplified as one aspect of the present disclosure. In other words, the present disclosure is not limited to the exemplary embodiment described above and can be embodied in various forms without departing from the technical concept of the present disclosure.

For example, although the shape of the contact portion 5 is described in detail in the above embodiments, provided that the contact portion 5 has a structure in which it is in contact with the conductive member and is electrically connected to the conductive member, its specific shape is not limited. In addition, the shapes of the first side wall portion 9A and the second side wall portion 9B are not limited to a specific shape, and whether or not to include the first side wall portion 9A and the second side wall portion 9B may be freely decided.

In addition, in the above-described embodiments, although an example is illustrated of a contact portion 5 having one protrusion 17, the number of the protrusions 17 may be two or more. If the number of contact points is increased by increasing the number of protrusions 17, the number of conductive paths correspondingly increases. In this way, it is possible to reduce the impedance of the contact 1.

Additionally, a predetermined function realized by a single constituent element in the above-described embodiments may instead be realized by a plurality of constituent elements working in tandem. Alternatively, a plurality of functions provided by a corresponding plurality of constituent elements, or a predetermined function realized by a plurality of constituent elements working in tandem, may be realized by a single constituent element. Parts of the configurations in the above-described embodiments may be omitted. At least part of the configuration of one of the above-described embodiments may be added to or replace the configuration of another embodiment described above. Note that all aspects encompassed within the technical spirit defined only by the language of the appended claims correspond to the embodiments of the present disclosure.

Supplementary Description

Note that as is clear from the exemplary embodiment described above, the contact according to the present disclosure may be further provided with configurations such as those given below.

First, in the contact of the present disclosure, the first bending portion and the second bending portion are configured such that the ratio R2/R1 of the curvature radius R2 of the second bending portion to the curvature radius R1 satisfies $0.25 \leq R2/R1 \leq 4.17$.

In a contact configured in this way, the reason that the ratio R2/R1 of the curvature radius R2 of the second bending portion to the curvature radius R1 of the first bending portion is made to satisfy $0.25 \leq R2/R1 \leq 4.17$ is to prevent the maximum stress value generated in the first bending portion from becoming excessively large. The possibility that the maximum stress value generated in the first bending portion may become excessively large is also a matter predicted by the simulation software. If the maximum stress value generated at the first bending portion becomes excessively large, it is conjectured that breakage at the spring portion is likely to occur. Accordingly, by maintaining the ratio R2/R1 within the numerical range as described above, breakage in the spring portion can be suppressed by preventing the maximum stress value generated in the first bending portion from becoming excessively large.

In addition, the contact of the present disclosure may include a first side wall portion and a second side wall portion that extend from the base portion and are erected at positions on both sides of the spring portion with the respective second surfaces opposing each other; a first through-hole provided in the first side wall portion and opened in a plate thickness direction of the first side wall portion; a second through-hole provided in the second side wall portion and opened in a plate thickness direction of the second side wall portion; and a first projecting piece and a second projecting piece provided on a portion extending from the contact portion and disposed between the first side wall portion and the second side wall portion, wherein the first projecting piece and the second projecting piece protrude from both sides of the portion disposed between the first side wall portion and the second side wall portion, and are configured such that one of the first projecting piece and the second projecting piece passes through the first through-hole and another passes through the second through-hole, and an operating range of each of the first projecting piece and the second projecting piece is restricted by inner peripheries of the through-holes.

According to a contact configured in this way, the operating ranges of the first projecting piece and the second projecting piece are restricted by the first through-hole and the second through-hole. For this reason, the operating range of the contact portion that moves together with the first projecting piece and the second projecting piece can also be restricted. Accordingly, the contact portion is not displaced to an unexpected location due to the elastic deformation of the spring portion, and a state in which the contact portion is properly in contact with the conductive member can be maintained.

In addition, in the contact of the present disclosure, the contact portion may include a protrusion protruding toward the conductive member.

According to a contact configured this way, the contact portion includes a protrusion. For this reason, it is possible to reliably bring the contact portion into contact with the conductive member at a location where the protrusion is present. In addition, when the conductive member is brought into contact with the protrusion, the contact pressure can be concentrated into a narrower range as compared with cases where the conductive member is in contact with a wider surface than the protrusion. Accordingly, when the contact pressure is concentrated in such a narrow range, the oxide film generated in such a range can be easily scraped, and a state with favorable conductivity can be easily maintained.

The invention claimed is:

1. A contact configured to electrically connect a conductor pattern of an electronic circuit board and a conductive member other than the electronic circuit board by being soldered to the conductor pattern and coming into contact with the conductive member, the contact comprising:

a base portion;

a contact portion; and a spring portion;

wherein the base portion includes a bonding surface configured to be soldered to the conductor pattern, the contact portion is configured to come into contact with the conductive member, the spring portion is a portion interposed between the base portion and the contact portion, and is configured to press the contact portion toward the conductive member by elastically deforming in a case where the contact portion is in contact with the conductive member, the base portion, the contact portion, and the spring portion are integrally molded with a thin plate formed of a metal, the spring portion includes a first bending portion, a flat plate portion, and a second bending portion, the first bending portion is a portion extending from the base portion, and is configured to bend into a shape that forms a circular arc in which a thickness direction of the thin plate is a radial direction, the flat plate portion is configured to extend in a flat plate shape from a location on a side opposite to the base portion of the first bending portion, the second bending portion is a portion extending from a location on a side opposite to the first bending portion of the flat plate portion, and is configured to bend into a shape that forms a circular arc in which a thickness direction of the thin plate is a radial direction, of two surfaces on a front side and a back side of the thin plate, a surface that forms the bonding surface is defined as a first surface, and a surface on a back side of the first surface is defined as a second surface, the first bending portion is bent such that the first surface is on an outer peripheral side, the second bending portion is bent such that the second surface is on an outer peripheral side, the thin plate has a plate thickness t of from 0.10 to 0.15 mm, the first bending portion has a curvature radius R1 of from 0.6 to 1.0 mm, and the flat plate portion and the first bending portion are configured such that a ratio L/R1 of a length L between the first bending portion and the second bending portion of the flat plate portion to the curvature radius R1 satisfies $0<L/R1\leq4$.

2. A contact configured to electrically connect a conductor pattern of an electronic circuit board and a conductive member other than the electronic circuit board by being soldered to the conductor pattern and coming into contact with the conductive member, the contact comprising:

a base portion;

a contact portion; and a spring portion;

wherein the base portion includes a bonding surface configured to be soldered to the conductor pattern, the contact portion is configured to come into contact with the conductive member, the spring portion is a portion interposed between the base portion and the contact portion, and is configured to press the contact portion toward the conductive member by elastically deforming in a case where the contact portion is in contact with the conductive member, the base portion, the contact portion, and the spring portion are integrally molded with a thin plate formed of a metal, the spring portion includes a first bending portion and a second bending portion, the first bending portion is a portion extending from the base portion, and is configured to bend into a shape that forms a circular arc in which a thickness direction of the thin plate is a radial direction, the second bending portion is a portion extending from a location on a side opposite to the first bending portion of the first bending portion, and is configured to bend into a shape that forms a circular arc in which a thickness direction of the thin plate is a radial direction, of two surfaces on a front side and a back side of the thin plate, a surface that forms the bonding surface is defined as a first surface, and a surface on a back side of the first surface is defined as a second surface, the first bending portion is bent such that the first surface is on an outer peripheral side, the second bending portion is bent such that the second surface is on an outer peripheral side, the thin metal plate has a plate thickness t of from 0.10 to 0.15 mm, and the first bending portion has a curvature radius R1 of from 0.6 to 1.0 mm.

3. The contact according to claim 1, wherein, the first bending portion and the second bending portion are configured such that a ratio R2/R1 of a curvature radius R2 of the second bending portion to the curvature radius R1 satisfies $0.25\leq R2/R1\leq4.17$.

4. The contact according to claim 1, further comprising:

a first side wall portion and a second side wall portion that extend from the base portion and are erected at positions on both sides of the spring portion with the respective second surfaces opposing each other;

a first through-hole provided in the first side wall portion and opened throughout the first side wall portion in a plate thickness direction;

a second through-hole provided in the second side wall portion and opened throughout the second side wall portion in a plate thickness direction of; and a first projecting piece and a second projecting piece provided to extend from the contact portion and disposed on a portion between the first side wall portion and the second side wall portion, the first projecting piece and the second projecting piece protruding from both sides of the portion disposed between the first side wall portion and the second side wall portion, and being configured such that one of the first projecting piece and the second projecting piece passes through the first through-hole and another passes through the second through-hole, and a movement range of each of the first projecting piece and the second projecting piece is restricted by an inner periphery of the first through-hole and the second through-hole.

5. The contact according to claim 1, wherein, the contact portion includes a protrusion protruding toward the conductive member.

6. The contact according to claim 2, wherein, the first bending portion and the second bending portion are configured such that a ratio R2/R1 of a curvature radius R2 of the second bending portion to the curvature radius R1 satisfies $0.25 \le R2/R1 \le 4.17$.

7. The contact according to claim 2, further comprising:

a first side wall portion and a second side wall portion that extend from the base portion and are erected at positions on both sides of the spring portion with the respective second surfaces opposing each other;

a first through-hole provided in the first side wall portion and opened throughout the first side wall portion in a plate thickness direction;

a second through-hole provided in the second side wall portion and opened throughout the second side wall portion in a plate thickness direction; and a first projecting piece and a second projecting piece provided to extend from the contact portion and disposed on a portion between the first side wall portion and the second side wall portion, the first projecting piece and the second projecting piece protruding from both sides of the portion disposed between the first side wall portion and the second side wall portion, and being configured such that one of the first projecting piece and the second projecting piece passes through the first through-hole and another passes through the second through-hole, and a movement range of each of the first projecting piece and the second projecting piece is restricted by an inner periphery of the first through-hole and the second through-hole.

8. The contact according to claim 2, wherein:

the contact portion includes a protrusion protruding toward the conductive member.

9. The contact according to claim 3, further comprising:

a first side wall portion and a second side wall portion that extend from the base portion and are erected at positions on both sides of the spring portion with the respective second surfaces opposing each other;

a first through-hole provided in the first side wall portion and opened throughout the first side wall portion in a plate thickness direction;

a second through-hole provided in the second side wall portion and opened throughout the second side wall portion in a plate thickness direction; and a first projecting piece and a second projecting piece provided to extend from the contact portion and disposed on a portion between the first side wall portion and the second side wall portion, the first projecting piece and the second projecting piece protruding from both sides of the portion disposed between the first side wall portion and the second side wall portion, and being configured such that one of the first projecting piece and the second projecting piece passes through the first through-hole and another passes through the second through-hole, and a movement range of each of the first projecting piece and the second projecting piece is restricted by an inner periphery of the first through-hole and the second through-hole.

10. The contact according to claim 3, wherein:

the contact portion includes a protrusion protruding toward the conductive member.

11. The contact according to claim 6, further comprising:

a first side wall portion and a second side wall portion that extend from the base portion and are erected at positions on both sides of the spring portion with the respective second surfaces opposing each other;

a first through-hole provided in the first side wall portion and opened throughout the first side wall portion in a plate thickness direction;

a second through-hole provided in the second side wall portion and opened throughout the second side wall portion in a plate thickness direction; and a first projecting piece and a second projecting piece provided to extend from the contact portion and disposed on a portion between the first side wall portion and the second side wall portion, the first projecting piece and the second projecting piece protruding from both sides of the portion disposed between the first side wall portion and the second side wall portion, and being configured such that one of the first projecting piece and the second projecting piece passes through the first through-hole and another passes through the second through-hole, and an operating range of each of the first projecting piece and the second projecting piece is restricted by an inner periphery of the first through-hole and the second through-hole.

12. The contact according to claim 6, wherein:

the contact portion includes a protrusion protruding toward the conductive member.

* * * * *